(12) United States Patent
Patterson

(10) Patent No.: US 7,564,267 B1
(45) Date of Patent: Jul. 21, 2009

(54) THERMAL ELECTRIC LOGIC CIRCUIT

(75) Inventor: Joseph Martin Patterson, Carlsbad, CA (US)

(73) Assignee: Sharp Laboratories of America, Inc., Camas, WA (US)

( * ) Notice: Subject to any disclaimer, the term of this patent is extended or adjusted under 35 U.S.C. 154(b) by 37 days.

(21) Appl. No.: 12/040,765

(22) Filed: Feb. 29, 2008

Related U.S. Application Data

(63) Continuation-in-part of application No. 12/032,549, filed on Feb. 15, 2008.

(51) Int. Cl.
    *H03K 19/20* (2006.01)
(52) U.S. Cl. .................... 326/104; 326/7; 326/136
(58) Field of Classification Search .............. 326/1, 326/7, 52, 54, 104, 136
    See application file for complete search history.

(56) References Cited

U.S. PATENT DOCUMENTS 3,461,272 A * 8/1969 Hirsbrunner ................ 219/505
3,548,293 A * 12/1970 Hirsbrunner ................ 323/352

* cited by examiner

*Primary Examiner*—Anh Q Tran
(74) *Attorney, Agent, or Firm*—Law Office of Gerald Maliszewski; Gerald Maliszewksi

(57) ABSTRACT

A thermal electric binary logic circuit is provided along with a method for switching a thermal electric binary logic circuit. The method accepts an input voltage representing an input logic state and generates a thermal electric (TE) temperature value in response to the input voltage. Then, in response to the TE temperature value, a TE voltage is generated and supplied as an output voltage representing an output logic state. In one aspect, a first TE element is connected to the input voltage and to a current source/sink having an intermediate voltage. As a result, the first TE element generates a first temperature reference. A second TE thermally is connected to the first TE, electrically connected to a first voltage reference, and electrically connected to an output to supply the output voltage. As a result, a first voltage varies across the second TE in response to the first temperature.

29 Claims, 8 Drawing Sheets

THERMAL ELECTRIC LOGIC CIRCUIT

RELATED APPLICATIONS

This application is a Continuation-in-part of a pending patent application entitled, SOLID STATE THERMAL ELECTRIC LOGIC, invented by Joseph Patterson, Ser. No. 12/032,549, filed Feb. 15, 2008, which is incorporated herein by reference.

BACKGROUND OF THE INVENTION

1. Field of the Invention

This invention generally relates to binary logic circuitry and, more particularly, to a solid state logic device made from thermal electric components instead of semiconductor transistors.

2. Description of the Related Art

Three-element (cathode/grid/plate) triode tubes and transistors are widely understood electronic devices used for signal processing and logic operations. It is obvious the transistors are a cornerstone of modern technology. However, designers are beginning to bump against physical limitations associated with transistors which impede circuit size and performance. For example, transistor device sizes are limited by the thickness of the gate insulation that can be formed. However, thin oxide layers are sensitive to contamination and break down voltages. More generally, transistors are subject to failure when exposed to electromagnetic pulses (EMP), cosmic rays, electrostatic discharge (ESD), and Alpha particle radiation. Further, many of the processes associated with conventional complementary metal oxide semiconductor (CMOS) integrated circuits (ICs) are complicated, use high process temperatures, involve the use of poisonous materials, and expensive fabrication equipment.

It would be advantageous if electronic switches and logic elements could be made with a technology other than solid state semiconductor transistors.

SUMMARY OF THE INVENTION

A solid state electronic switching device and circuit element is presented that requires no active semiconductor diodes, transistors, or vacuum tubes, and which can be configured into basic circuit blocks performing logic functions. The solid state switching circuit element can be fabricated without expensive semiconductor processing, is insensitive to contamination, and operates with a wide range of supply voltages, from volts down to the tens of millivolt range. The device is highly insensitive to EMP, cosmic rays, ESD, and Alpha particles. Because only lower temperature "back end" processing steps are utilized, multiple active layers and connective layers can be stacked vertically on the same substrate for 3D construction, permitting high density circuits to be fabricated. Since fewer steps are involved, fewer types of chemicals are used, and a lower volume of chemicals are required. Also, because of the lower temperatures, less energy is consumed in the manufacturing.

Thermal electrical (TE) elements are used for sensing input voltages (input logic signals), creating a temperature responsive to the input voltage, and generating an output voltage responsive to temperature. Thermocouples and thermopiles are examples of some conventional TE elements.

Accordingly, a method is provided for controlling a thermal electric binary logic circuit. The method accepts an input voltage representing an input logic state and generates a thermal electric (TE) temperature value in response to the input voltage. Then, in response to the TE temperature value, a TE voltage is generated and supplied as an output voltage representing an output logic state.

In one aspect, generating the TE heat reference includes providing a first TE element connected to the input voltage and to a current source/sink having an intermediate voltage, approximately midway between an input logic high voltage and an input logic low voltage. As a result, the first TE element generates a first temperature value. In one aspect, when the input voltage is high (logic high), current flows from the input to the current sink, and the first temperature increases. When the input voltage is low (logic low), current flows from the current source to the input, and the first temperature decreases.

Generating the TE voltage includes providing a second TE thermally connected to the first TE, electrically connected to a first voltage reference, and electrically connected to an output to supply the output voltage. As a result, a first voltage varies across the second TE in response to the first temperature.

Additional details of the above-described method and thermal electric logic circuitry are provided below.

DETAILED DESCRIPTION

Figure 1:
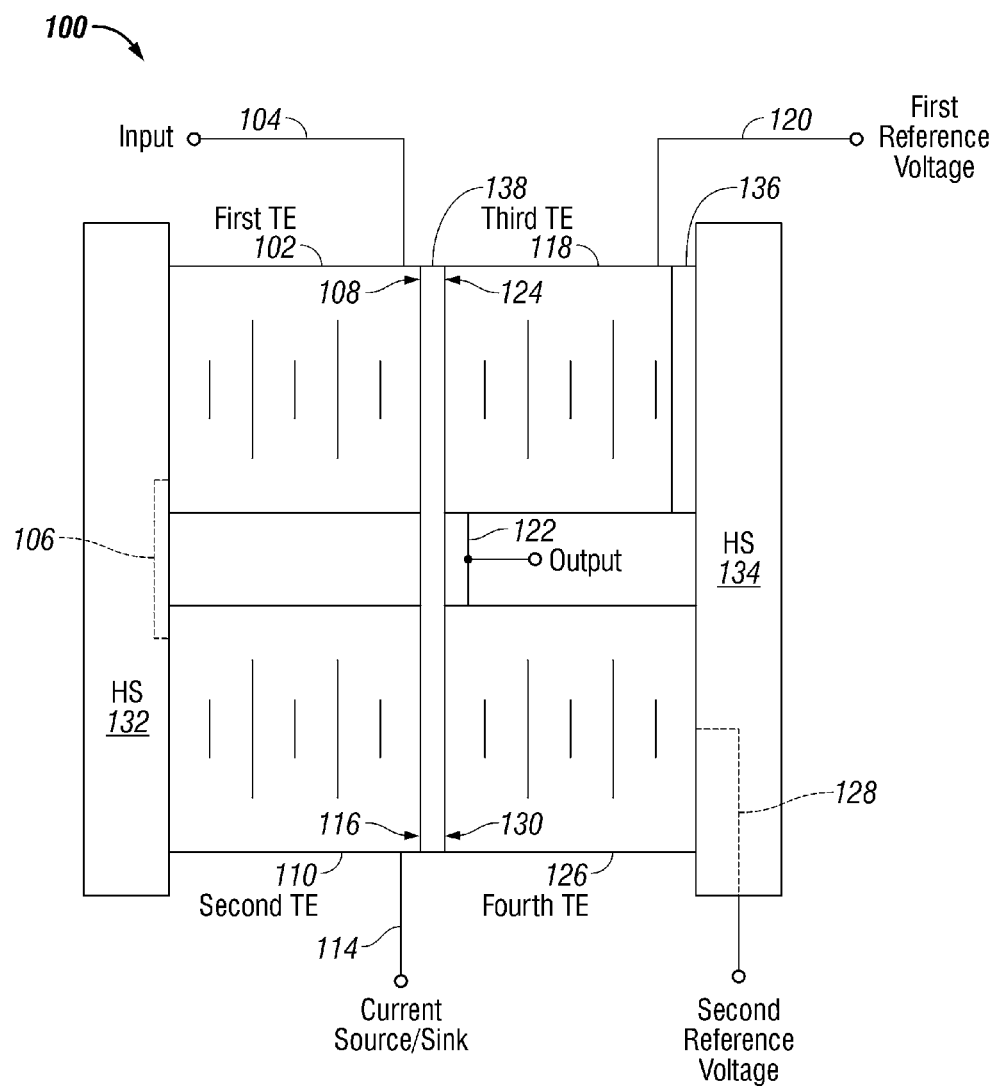
FIG. 1 is a schematic block diagram of a thermal electric binary logic circuit.

FIG. 1 is a schematic block diagram of a thermal electric binary logic circuit. The logic circuit 100 comprises a first thermal electric (TE) element 102 having a first electrical interface connected on line 104 to accept an input voltage representing an input logic state and a second electrical interface connected on line 106. The first TE element 102 has a thermal interface 108 to supply a first temperature responsive to the input voltage on line 104. A second TE element 110 has a first electrical interface, electrically connected to the first TE second electrical interface on line 106, and a second electrical interface connected with line 114 to a current source/sink. The current source/sink reference on line 114 has an intermediate voltage, approximately midway between an input logic high voltage and an input logic low voltage. The second TE element 110 has a thermal interface 116 to supply a second temperature responsive to the input voltage. When the input voltage is high (logic high), current from the input on line 104 to the current sink on line 114. As a result, the thermal interface 108 increases in temperature and thermal interface 116 decreases in temperature. When the input voltage is low (logic low), current flows from the current source on line 114 to the input on line 104. As a result, thermal interface 116 increases in temperature and thermal interface 108 decreases in temperature.

A third TE element 118 has a first electrical interface connected on line 120 to a first reference voltage and a second electrical interface connected on line 122 to supply an output voltage. The third TE element 118 has a thermal interface 124 thermally connected to the first TE element thermal interface 108. A fourth TE element 126 has a first electrical interface connected on line 122 to the third TE element second electrical interface, and a second electrical interface connected on line 128 to a second reference voltage. The fourth TE element 126 has a thermal interface 130 thermally connected to the second TE element thermal interface 116.

As explained in more detail below, a TE element is defined as an element that relies upon the Peltier effect to convert current into temperature, and the Thomson effect to convert temperature into voltage.

A first heatsink (HS) 132 is thermally connected to the first TE element second electrical interface and to the second TE element first electrical interface. In the aspect shown, the first HS 132 is electrically conductive, so that the electrical connection on line 106 (shown as a dotted line) is made through the HS. Alternately but not shown, the first and second TE elements may be electrically isolated from HS 132, and electrical connection represented by line 106 is made independent of the heatsink. In another aspect, the heatsink is not electrically conductive.

A second heatsink 134 is thermally connected to the third TE element first electrical interface and to the fourth TE element second electrical interface. In the aspect shown, the second HS 134 is electrically conductive, so that the electrical connection on line 128 (shown as a dotted line) is made through the HS. To isolate the first and second voltages, a thermally conductive electrical insulator 136 is interposed between HS 134 and the third TE element first electrical interface connected on line 120. A thermally conductive electrical insulator 138 is interposed between the first TE element 102 and the third TE element 118. Likewise, insulator 138 is interposed between the second TE element 110 and the fourth TE element 126.

In the aspect shown, the first TE element first electrical interface connected on line 104 and thermal interface 108 are the same. That is, line 104 is connected in close proximity to thermal interface 108. Alternately stated, thermal interface 108 acts as the first electrical interface. Also, the second TE element second electrical interface connected on line 114 and thermal interface 116 are the same. Assuming that the first voltage reference has a higher potential than the second voltage reference, then the third TE element second electrical interface connected on line 122 supplies a logic signal inverted from the input signal. Alternately, if the first voltage reference has a lower potential than the second voltage reference, then the third TE element second electrical interface connected on line 122 supplies a logic signal non-inverted from the input signal.

Figure 2:
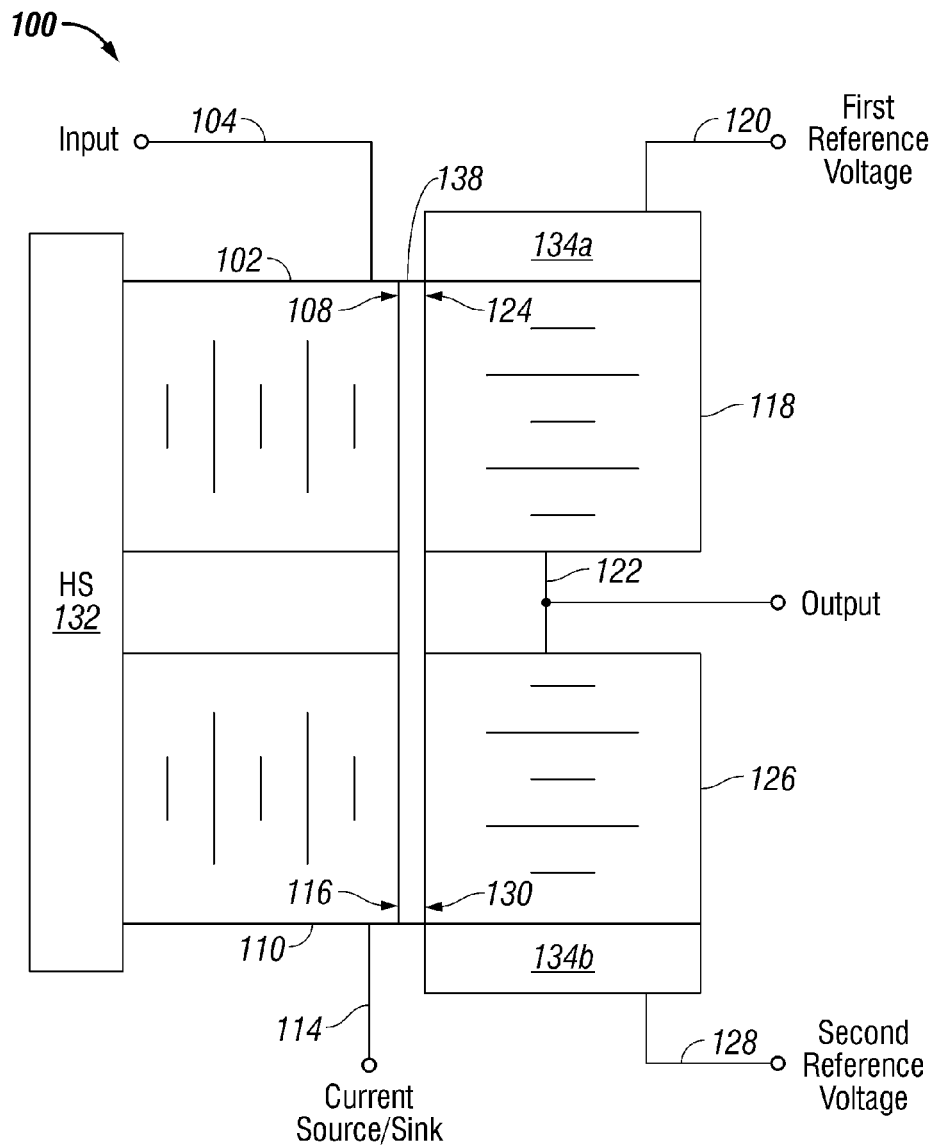
FIG. 2 is a schematic block diagram depicting a first variation of the logic circuit of FIG. 1.

FIG. 2 is a schematic block diagram depicting a first variation of the logic circuit of FIG. 1. In this variation, the third TE thermal interfaces 124 is not the same as the second electrical interface associated with line 122. Likewise, the fourth TE element thermal interface 130 is not the same as the first electrical interface associated with line 122. This configuration has the advantage of more evenly distributing temperature from the first and second TE thermal interfaces across the third and fourth TE elements, respectively.

Figure 3:
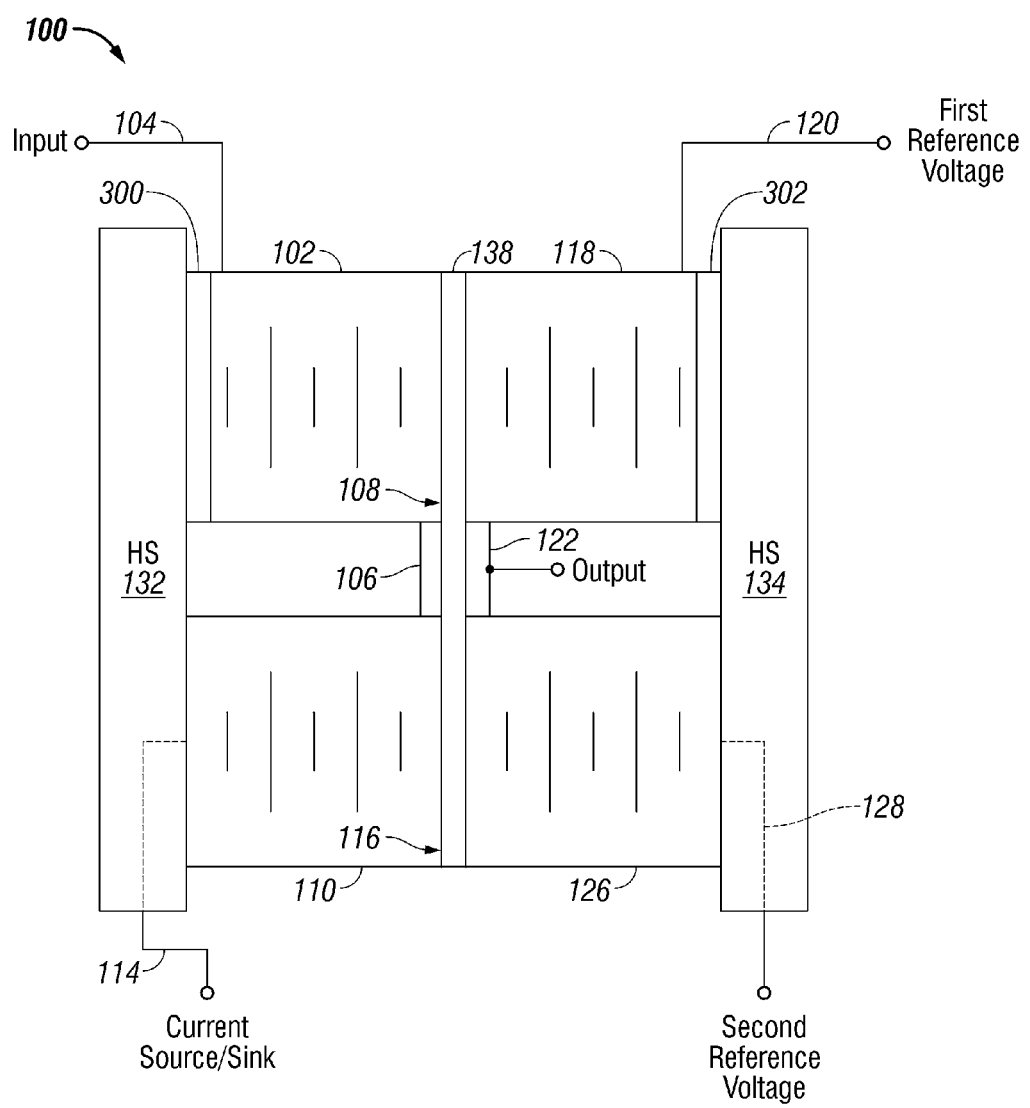
FIG. 3 is a schematic block diagram depicting a second variation of the logic circuit of FIG. 1.

FIG. 3 is a schematic block diagram depicting a second variation of the logic circuit of FIG. 1. The first heatsink 132 is thermally connected to the first TE element first electrical interface connected on line 104 and to the second TE element second electrical interface connected on line 114. The second heatsink 134 thermally connects to the third TE element first electrical interface connected on line 120 and to the fourth TE element second electrical interface connected on line 128. A thermally conductive electrical insulator 300 is interposed between the first HS 132 and the first TE element first electrical interface connected on line 104. A thermally conductive electrical insulator 302 is interposed between the second HS 134 and the third TE element first electrical interface connected on line 120. Again it is assumed that the first HS 132 and the second HS 134 are electrically conductive. However, they need not necessarily be electrically conductive. A thermally conductive electrical insulator 138 is interposed between the first TE element 102 and the third TE element 118. Likewise, insulator 138 is interposed between the second TE element 110 and the fourth TE element 126.

As shown, the first TE element second electrical interface connected on line 106 and thermal interface 108 are the same. Also, the second TE element first electrical interface connected on line 106 and thermal interface 116 are the same. If the first voltage reference has a higher potential than the second voltage reference, then the third TE element second electrical interface connected on line 122 supplies a logic signal non-inverted from the input signal. Alternately, if the first voltage reference has a lower potential than the second voltage reference, then the third TE element second electrical interface connected on line 122 supplies a logic signal inverted from the input signal.

Although not specifically shown, the circuit of FIG. 3 could be modified in a manner similar to FIG. 2, so that the thermal interface of the third TE element does not exactly match the second electrical interface. Likewise, the thermal interface of the fourth TE element need not match the fourth TE element first electrical interface.

The first TE element 102, second TE element 110, third TE element 118, and fourth TE element 126 are all thermocouples. That is, each TE element includes at least one thermocouple. As explained in more detail below, a TE element is typically a thermopile, which includes a plurality of (series) stacked thermocouples. The temperature difference across a thermocouple is due to heat changes resulting from electrical current flow. If current drains from a TE element electrical interface, the temperature at that interface is lower than at the electrical interface sourcing the current. Likewise, when current sources into a TE element electrical interface, that interface has a higher temperature than the opposite electrical interface where the current is being sunk.

The performance of thermal electric devices is based upon two effects: the Peltier effect and the Thomson effect. The Peltier effect defines the results when a single junction made from two different materials is joined and a current is sent through the junction while it is maintained at constant temperature. Under these conditions a heat flow takes place between the junction and it surroundings. The amount of Peltier heat transferred at any junction is proportional to the current through the junction and that the transfer reverses direction when the direction of the current is reversed. Such a junction is a source within which electrical energy is converted to heat, or heat is converted to electrical energy. The Peltier emf developed across a junction made from materials "a" and "b" is defined as the heat absorbed or liberated per unit quantity of electricity crossing the junction. Mathematically, Pemf=Peltier Heat/Charge transfer.

The Thomson effect describes the behavior of a wire made from a single material with an electrical current passed down its length and the ends of the wire are at different temperatures. Under these conditions, the density of free electrons varies from point-to-point along the wire length, and heat is absorbed or liberated at all points down the wire. The "Thomson Heat" is proportional to the quantity of electricity passing through a section of wire and to the temperature difference between the ends of the section. The Thomson Heat is also reversible and depends on the nature of the wire and the average temperature of the section of the wire.

A thermal couple (thermocouple) consists of two wires of different materials that form two junctions. Thus, a thermal couple is made of two Peltier junctions and two wires exhibiting the Thomson effect. A thermal couple emf is the combination of these two effects. A thermopile is a device consisting of many thermal couples connected in series. The total emf of the thermopile is the sum of all the individual thermal couples.

The fundamental principle behind the behavior of all of these devices is the Seebeck Effect and is attributed to the fact that the density of free electrons is different for different materials, and within the same material, the density of free electrons is different at different temperatures.

The difference in free electron density results in a difference in force. The greater the free electron density, the greater is the force. The nature of the force is the electrostatic charge of the electron. Since the force is cumulative, more electrons per unit area or volume means the force is greater. For different materials forming a junction, the greater the difference in free electron density, the greater the emf. The emf is a thermal emf and called a Seebeck emf, after Thomas Johann Seebeck.

In an attempt to correct the imbalance of force at the junction, a current is enabled (charge transfer across the junction). The principles of physics state that a system always moves in a direction to lower its energy state. In this case, the system is a section of wire or a junction of two materials. A hotter section of wire is at a higher energy state and the electrons in the hotter section of wire are in a higher energy state. Thermal energy is the Kinetic energy (energy of motion) of the material including the electrons. Electrons can carry thermal energy and move from a higher energy state to a lower energy state. In other words, the electrons move from a hotter portion of the wire to a colder portion, carrying away heat away with them. Thus, TE elements act to bring into balance unequal forces due to the difference in free electron density resulting from temperature (or material differences in the case of a junction).

The above-mentioned principles are also at work in the operation of a semiconductor junction. The built-in potential of a semiconductor junction is a result of the difference in charge density of the two materials on the opposite sides of the junction. The charge density on the N-type side (free electron density due to impurity doping), and the different charge density and polarity of the holes on the N-type side (again due to impurity doping) results in an imbalance in electrostatic forces at the junction. In an attempt to correct the imbalance, charge is transferred across the junction and a built-in electric field results. This built-in field is measured externally as the forward diode drop of the semiconductor junction. It is also a thermal emf and changes with temperature. However, the thermal emf of a semiconductor junction is very negligible, and not useful in generating a measurable temperature responsive to current flow.

However, a thermocouple can be distinguished from a semiconductor junction. For example, a bismuth-telluride thermocouple is a bulk piece of BiTe doped with Antimony to make it N-type, with another bulk piece of BiTe doped to make it P-type. The two separate pieces are attached together, usually with solder, to form the completed TE element. There is no diode junction and it is not rectifying. The semiconductor material enhances the Peltier effect just as bismuth has the most favorable Peltier effect properties for a pure metal.

Although a thermocouple can be distinguished from a semiconductor junction (transistor type junction), it is technically possible for a semiconductor junction to be used as a TE element, as it can be used to convert current to temperature, and temperature to voltage, without the conventional transistor action that produces an inverted signal. However, a semiconductor junction would not make a practical TE element. For example, a conventional semiconductor junction cannot be simply interfaced to symmetrical logic high/logic low inputs. When forward biased (e.g., a logic high), current begins to flow when a threshold bias of about 0.6 volts is reached. Above this threshold, the junction begins to generate heat. However, to reverse bias the junction (e.g., a logic low) requires a voltage difference of several volts until the reversed biased junction breaks down and conducts current. If a logic high causes current to flow in one direction, a logic low is unlikely to cause current flow in the opposite direction. Further, the relationship between forward biased and reversed biased current flow is non-linear. Even if logic signals could cause current flow in opposite directions, the current amplitudes would be orders of magnitude different. Linear temperature changes are not possible if the forward biased and reversed biased current flows are non-linear. In practice, such a junction would only produce a noticeable temperature change in one direction.

In summary, if a conventional semiconductor junction can be considered a TE element, it is not a practical one, because of the asymmetrical logic inputs that would be required for switching, because of non-linear current (temperature) flows, and because of its insufficient heating/cooling changes with respect to changes in current and voltage. Advantageously, the present invention TE elements need not be made from a semiconductor material or form a PN junction. Even if they TE element is made from a semiconductor junction, the PN junction need not be biased to enable the Peltier and Thomson effects.

The TE elements described in FIGS. 1-3 may be enabled as thermocouples, or thermopiles made from alternating layers of bismuth and nickel, or bismuth and copper. Bismuth has the highest thermal electric properties of any metal. The stack of layers may be interdigitated metals. Thermocouples can also be made from tellurium, which is a doped semiconductor. In one aspect, bismuth-telluride layer may be stacked between a metal such as copper. Alternately, the TE elements may be a stack of layers made from a single material. The logic circuitry of FIGS. 1-3 is not limited to any particular thermocouple design or materials.

Table 1 lists constants associated with the emf of a nickel and bismuth thermopile of 1 layer, 10 layers, and 25 layers, at different temperatures, where:

$$emf = (a1-a2)t + \tfrac{1}{2}(b1-b2)t^2, \text{ where}$$

t=temperature (C);

a1 and b1 are constants associated with nickel; and, a2 and b2 are constants associated with bismuth.

TABLE 1

| a1 | b1 | a2 | b2 | temperature C | emf In millivolts one layer | emf in millivolts ten layers | emf in millivolts 25 layers | metals |
|---|---|---|---|---|---|---|---|---|
| 19.1 | −43.7 | −0.03 | −0.47 | 25 | 0.9225 | 9.225 | 23.0625 | nickel and bismuth |
| 19.1 | −43.7 | −0.03 | −0.47 | 100 | 5.34 | 53.4 | 133.5 | nickel and bismuth |
| 19.1 | −43.7 | −0.03 | −0.47 | 125 | 7.3625 | 73.625 | 184.0625 | nickel and bismuth |
| 19.1 | −43.7 | −0.03 | −0.47 | 0 | 0 | 0 | 0 | nickel and bismuth |

TABLE 1-continued

| a1 | b1 | a2 | b2 | temperature C | emf In millivolts one layer | emf in millivolts ten layers | emf in millivolts 25 layers | metals |
|---|---|---|---|---|---|---|---|---|
| 19.1 | −43.7 | −0.03 | −0.47 | 5 | 0.1625 | 1.625 | 4.0625 | nickel and bismuth |
| 19.1 | −43.7 | −0.03 | −0.47 | 10 | 0.336 | 3.36 | 8.4 | nickel and bismuth |
| 19.1 | −43.7 | −0.03 | −0.47 | 15 | 0.5205 | 5.205 | 13.0125 | nickel and bismuth |
| 19.1 | −43.7 | −0.03 | −0.47 | 20 | 0.716 | 7.16 | 17.9 | nickel and bismuth |
| 19.1 | −43.7 | −0.03 | −0.47 | 25 | 0.9225 | 9.225 | 23.0625 | nickel and bismuth |
| 19.1 | −43.7 | −0.03 | −0.47 | 30 | 1.14 | 11.4 | 28.5 | nickel and bismuth |
| 19.1 | −43.7 | −0.03 | −0.47 | 35 | 1.3685 | 13.685 | 34.2125 | nickel and bismuth |
| 19.1 | −43.7 | −0.03 | −0.47 | 40 | 1.608 | 16.08 | 40.2 | nickel and bismuth |
| 19.1 | −43.7 | −0 03 | −0.47 | 45 | 1.8585 | 18.585 | 46.4625 | nickel and bismuth |
| 19.1 | −43.7 | −0.03 | −0.47 | 50 | 2.12 | 21.2 | 53 | nickel and bismuth |
| 19.1 | −43.7 | −0.03 | −0.47 | 55 | 2.3925 | 23.925 | 59.8125 | nickel and bismuth |
| 19.1 | −43.7 | −0 03 | −0.47 | 60 | 2.676 | 26.76 | 66.9 | nickel and bismuth |
| 19.1 | −43.7 | −0.03 | −0.47 | 65 | 2.9705 | 29.705 | 74.2625 | nickel and bismuth |
| 19.1 | −43.7 | −0 03 | −0.47 | 70 | 3.276 | 32.76 | 81.9 | nickel and bismuth |
| 19.1 | −43.7 | −0 03 | −0.47 | 75 | 3.5925 | 35.925 | 89.8125 | nickel and bismuth |
| 19.1 | −43.7 | −0 03 | −0.47 | 80 | 3.92 | 39.2 | 98 | nickel and bismuth |
| 19.1 | −43.7 | −0.03 | −0.47 | 85 | 4.2585 | 42.585 | 106.4625 | nickel and bismuth |
| 19.1 | −43.7 | −0.03 | −0.47 | 90 | 4.608 | 46.08 | 115.2 | nickel and bismuth |
| 19.1 | −43.7 | −0.03 | −0.47 | 95 | 4.9685 | 49.685 | 124.2125 | nickel and bismuth |
| 19.1 | −43.7 | −0.03 | −0.47 | 100 | 5.34 | 53.4 | 133.5 | nickel and bismuth |
| 19.1 | −43.7 | −0.03 | −0.47 | 105 | 5.7225 | 57.225 | 143.0625 | nickel and bismuth |
| 19.1 | −43.7 | −0.03 | −0.47 | 110 | 6.116 | 61.16 | 152.9 | nickel and bismuth |
| 19.1 | −43.7 | −0.03 | −0.47 | 115 | 6.5205 | 65.205 | 163.0125 | nickel and bismuth |
| 19.1 | −43.7 | −0.03 | −0.47 | 120 | 6.936 | 69.36 | 173.4 | nickel and bismuth |
| 19.1 | −43.7 | −0 03 | −0.47 | 125 | 7.3625 | 73.625 | 184.0625 | nickel and bismuth |
| 19.1 | −43.7 | −0.03 | −0.47 | 130 | 7.8 | 78 | 195 | nickel and bismuth |
| 19.1 | −43.7 | −0.03 | −0.47 | 135 | 8.2485 | 82.485 | 206.2125 | nickel and bismuth |
| 19.1 | −43.7 | −0.03 | −0.47 | 140 | 8.708 | 87.08 | 217.7 | nickel and bismuth |
| 19 1 | −43.7 | −0.03 | −0.47 | 145 | 9.1785 | 91.785 | 229.4625 | nickel and bismuth |
| 19.1 | −43.7 | −0.03 | −0.47 | 150 | 9.66 | 96.6 | 241.5 | nickel and bismuth |

Figure 4:
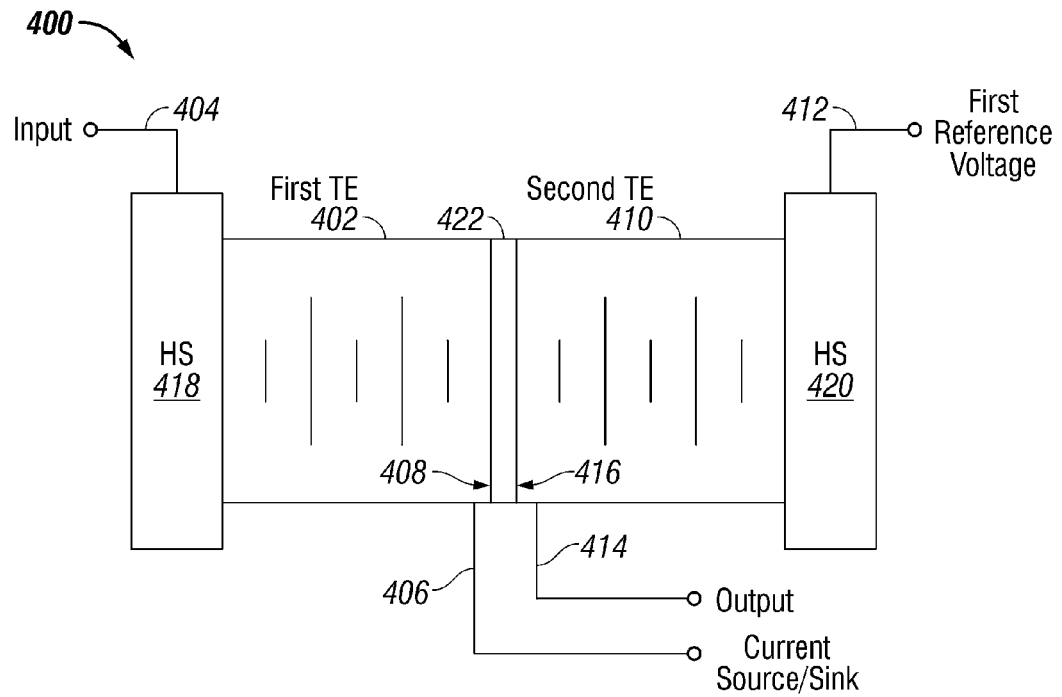
FIG. 4 is a schematic block diagram of a simple thermal electric binary logic circuit.

FIG. 4 is a schematic block diagram of a simple thermal electric binary logic circuit. The logic circuit 400 comprises a first TE element 402 having a first electrical interface connected on line 404 to accept an input voltage representing an input logic state, and a second electrical interface connected on line 406 to a current source/sink. Typically, the current source/sink is a reference having an intermediate voltage, approximately midway between an input logic high voltage and an input logic low voltage. The use of this intermediate voltage permits the current flow through the first TE 402 to reverse direction when the input voltage is switched from logic high to logic low. The reversal of current through first TE 402 permits thermal interface 408 to become either hot or cold with respect to heatsink 418, which acts as a temperature reference.

The first TE element 402 has a thermal interface 408 to supply a first temperature responsive to the input voltage. A second TE element 410 has a first electrical interface connected on line 412 to a first reference voltage, a second electrical interface connected on line 414 to supply an output voltage responsive to the first temperature, and a thermal interface 416 thermally connected to the first TE element thermal interface 408. A thermally conductive electrical insulator 422 is interposed between the first TE 402 and the second TE 410. The first and second TEs may be a thermocouple or a thermopile. When the input voltage is high (logic high), current flows from line 404 to the current sink on line 406, and the thermal interface decreases in temperature. When the input voltage is low (logic low), current flows from the current source on line 406 to the input on line 404, and thermal interface 408 increases in temperature.

In one aspect as shown, a first heatsink is thermally connected to the first TE element first electrical interface connected on line 404. A second heatsink 420 is thermally connected to the second TE element first electrical interface connected on line 412. In this aspect, heatsinks 418 and 420 are electrically conductive and conduct current to/from the TE electrical interfaces. However, in other aspects not shown, the heatsinks may be electrically insulated from the TE elements 402 and 410. Also as shown, the first TE element second electrical interface connected to line 408 and thermal interface 408 are the same. The second TE element second electrical interface connected to line 414 and thermal interface 416 are the same, and the second TE element supplies a logic signal on line 414 inverted from the input logic signal.

Figure 5:
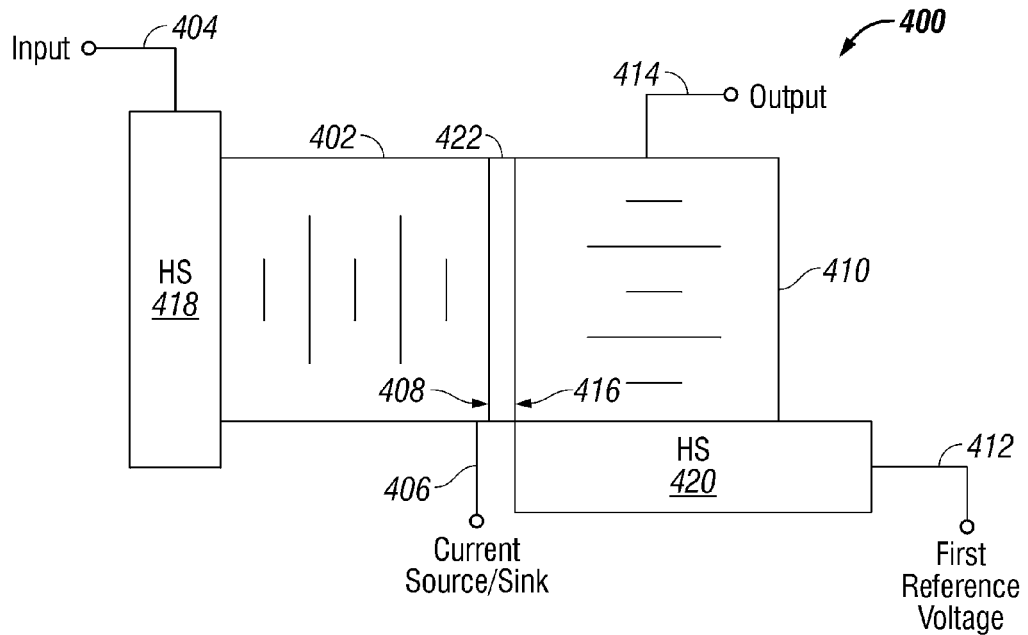
FIG. 5 is a schematic block diagram depicting a first variation of the logic circuit of FIG. 4.

FIG. 5 is a schematic block diagram depicting a first variation of the logic circuit of FIG. 4. In this variation, the second TE thermal interface 416 is not the same as the second electrical interface associated with line 414. This configuration has the advantage of more evenly distributing temperature from the first TE thermal interface 408 across the second TE element 410.

Figure 6:
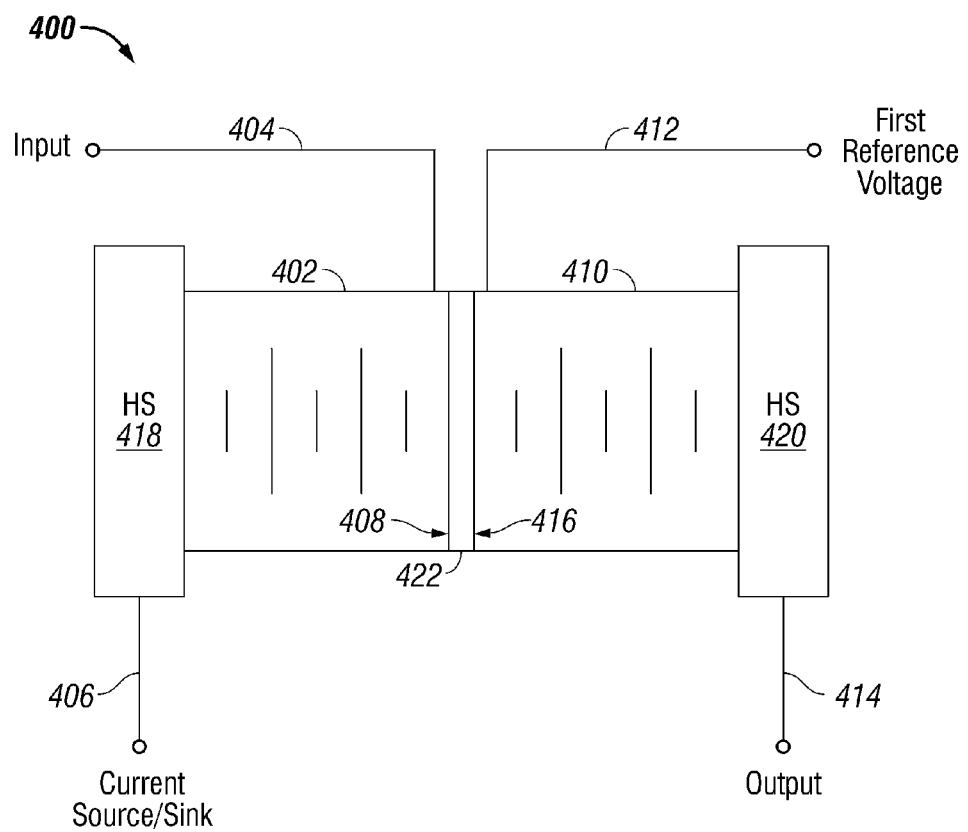
FIG. 6 is a schematic block diagram depicting a second variation of the logic circuit of FIG. 4.

FIG. 6 is a schematic block diagram depicting a second variation of the logic circuit of FIG. 4. In this aspect, the first heatsink 418 is thermally connected to the first TE element second electrical interface connected to line 406. The second heatsink 420 is thermally connected to the second TE element second electrical interface connected on line 414. As shown, the first TE element first electrical interface connected to line 404 and thermal interface 408 are the same. The second TE element first electrical interface connected to line 412 and thermal interface 416 are the same. The second TE element 410 supplies a logic signal on line 414 non-inverted from the input logic signal on line 404. The heatsinks are shown as electrically conductive, but alternately they may be insulators, or they may be electrically isolated from the TE elements.

Although not specifically shown, the circuit of FIG. 6 can be modified in a manner similar to FIG. 5, so that the thermal interface 416 of the second TE element 410 does not exactly match the second TE element first electrical interface connected on line 412.

Functional Description

Figure 7:
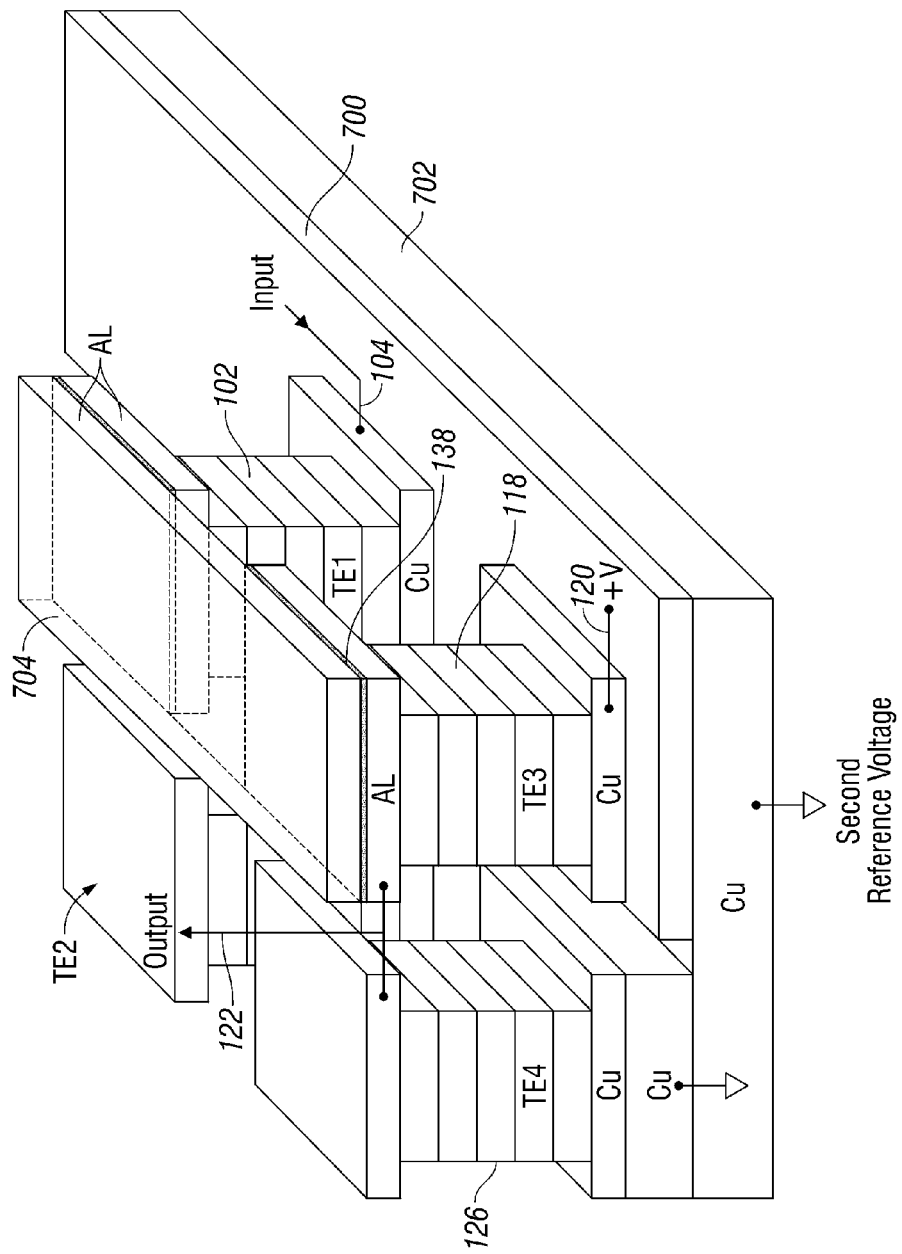
FIG. 7 is a perspective drawing illustrating a simple physical implementation of the device schematically depicted in FIG. 3.

FIG. 7 is a perspective drawing illustrating a simple physical implementation of the device schematically depicted in FIG. 3. The heatsinks may be Al or Cu, but other metals are known. Here, insulator 700 takes the place of insulators 300 and 302 (see FIG. 3), isolating both first and third TEs from an electrically conductive heatsink 702. Heatsink 702 takes the place of heatsinks 132 and 134 (FIG. 3). In this aspect, heatsink 704 thermally connects the thermal interfaces of the first TE 102 and the third TE 118. Not shown in the figure is a thermal conductor overlying both the second and fourth TEs, which is separated from at least one of these TEs by an electrical insulator.

Figure 8:
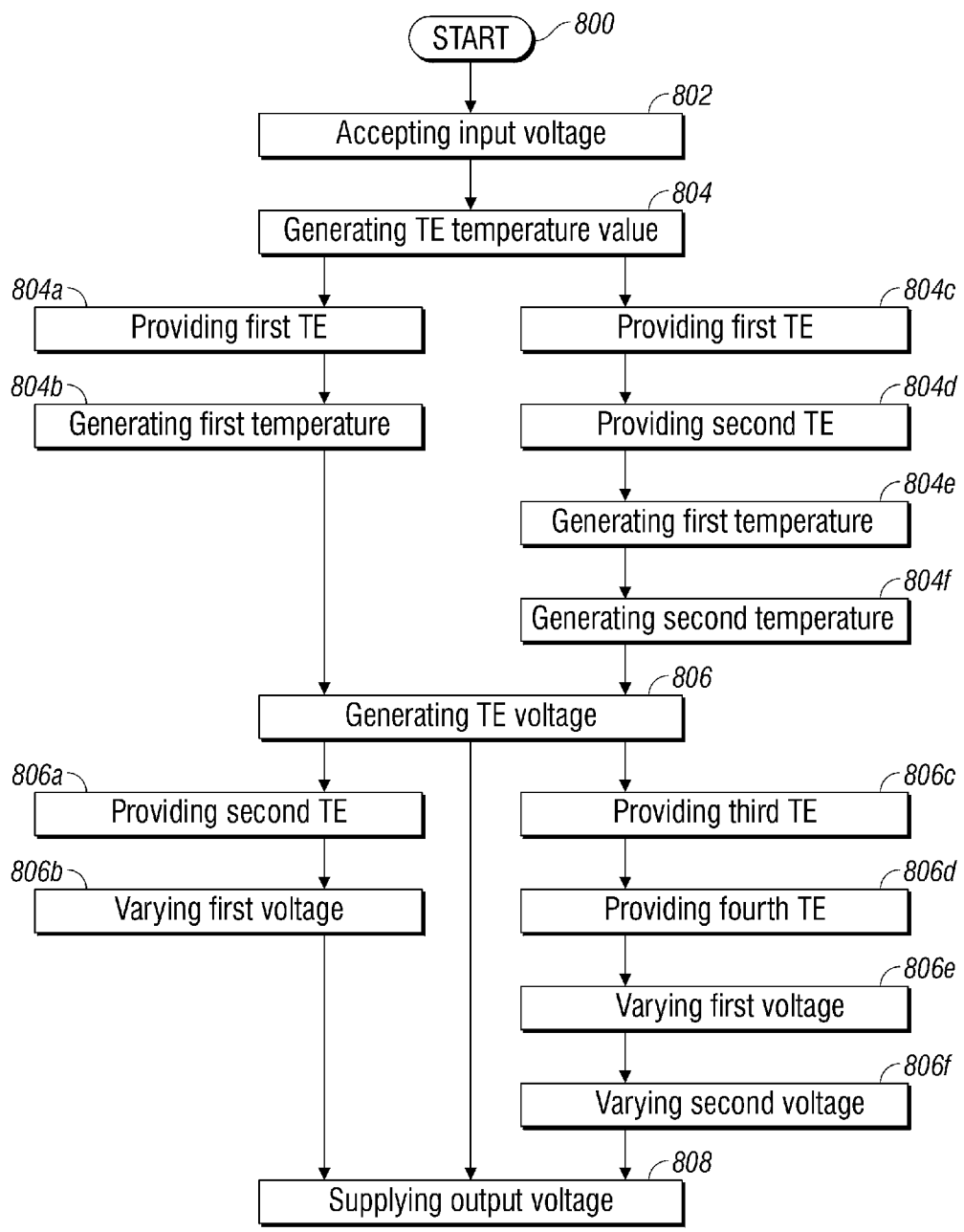
FIG. 8 is a flowchart illustrating a method for thermal electric binary logic circuit switching.

FIG. 8 is a flowchart illustrating a method for thermal electric binary logic circuit switching. Although the method is depicted as a sequence of numbered steps for clarity, the numbering does not necessarily dictate the order of the steps. It should be understood that some of these steps may be skipped, performed in parallel, or performed without the requirement of maintaining a strict order of sequence. The method starts at Step 800.

Step 802 accepts an input voltage representing an input logic state. Step 804 generates a thermal electric (TE) temperature value in response to the input voltage. In response to the TE temperature value, Step 806 generates a TE voltage. Step 808 supplies an output voltage representing an output logic state. If Step 802 accepts an input voltage representing a first logic state, then Step 808 supplies an output voltage representing an output logic of the first logic state or of a second logic state, opposite to the first logic state, depending of whether the logic circuit is designed as an inverter or a buffer (non-inverter).

In one aspect, generating the TE temperature value in Step 804 includes substeps. Step 804a provides a first TE element connected to the input voltage and a current source/sink having an intermediate voltage, approximately midway between an input logic high voltage and an input logic low voltage. In Step 804b, the first TE element generates a first temperature. Likewise, generating the TE voltage in Step 806 includes substeps. Step 806a provides a second TE thermally connected to the first TE, electrically connected to a first voltage reference, and electrically connected to an output to supply the output voltage. Step 806b varies a first voltage across the second TE in response to the first temperature.

In another aspect, generating the TE temperature value in Step 804 includes alternate substeps. Step 804c provides a first TE element connected to the input voltage. Step 804d provides a second TE element electrically connected to the first TE element and a current source/sink. As above, the current source/sink is a reference having an intermediate voltage, approximately midway between an input logic high voltage and an input logic low voltage. In Step 804e, the first TE generates a first temperature. In Step 804f, the second TE generates a second temperature.

Then, generating the TE voltage in Step 806 includes alternate substeps. Step 806c provides a third TE thermally connected to the first TE and electrically connected to a first voltage reference. Step 806d provides a fourth TE thermally connected to the second TE, and electrically connected to the third TE and a second reference voltage. Step 806e varies a first voltage across the third TE in response to the first temperature. Step 806f varies a second voltage across the fourth TE in response to the second temperature. Step 808 supplies an output voltage that is a ratio of the first voltage divided by the combination of the first and second voltages.

Figure 9A:
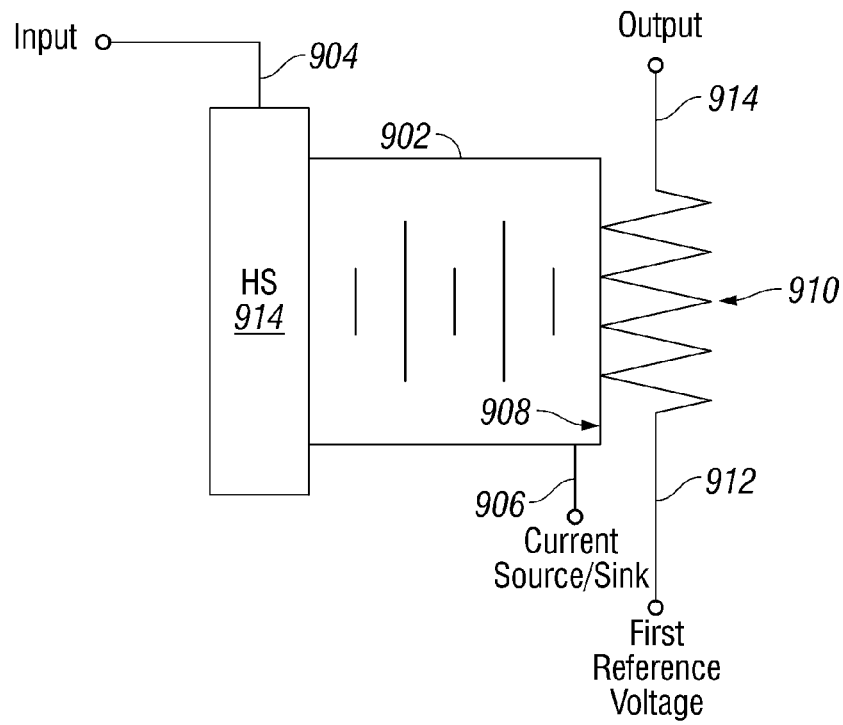
FIGS. 9A and 9B are schematic block diagrams of a thermal electric binary logic circuit using a thermistor element.
Figure 9B:
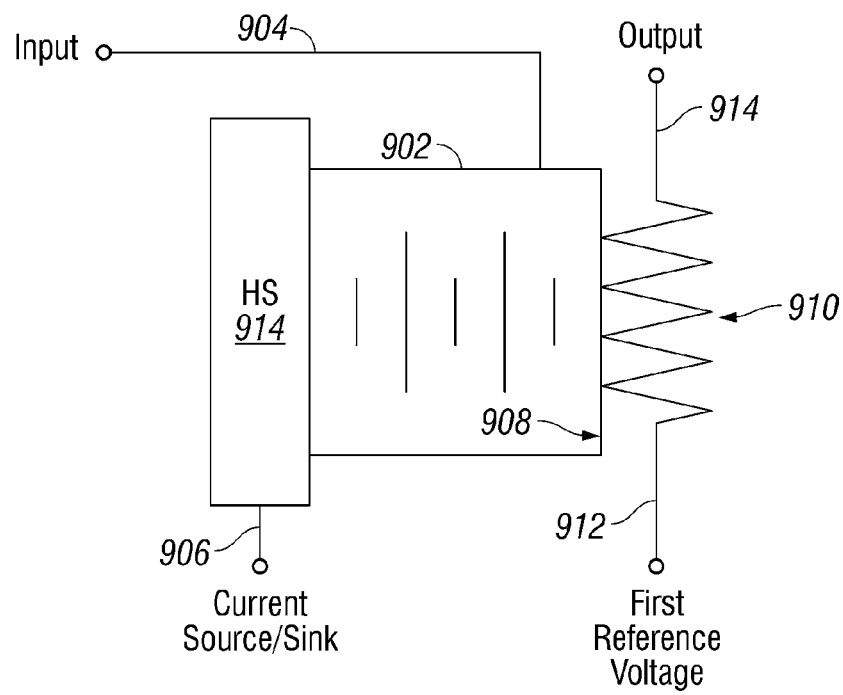

FIGS. 9A and 9B are schematic block diagrams of a thermal electric binary logic circuit using a thermistor element. The circuit 900 comprises a TE element 902 having a first electrical interface on line 904 to accept an input voltage representing an input logic state, a second electrical interface connected to a current source/sink on line 906, and a thermal interface 908 to supply a first temperature responsive to the input voltage. A thermistor 910 has a first electrical interface connected to a first reference voltage on line 912, a second electrical interface on line 914 to supply an output voltage responsive to the first temperature, and a thermal interface thermally connected to the first TE element thermal interface 908. The body of the thermistor is its thermal interface.

In FIG. 9A, the TE element second electrical interface on line 906 and thermal interface 908 are the same. The thermistor second electrical interface on line 914 supplies a logic signal inverted from the input logic signal. In FIG. 9B, the TE element first electrical interface on line 904 and thermal interface 908 are the same. The thermistor second electrical interface on line 914 supplies a logic signal non-inverted from the input logic signal.

The TE 902 is a thermocouple, as explained in detail above. The thermistor 910 may have a positive coefficient, negative coefficient, linear coefficient, non-linear coefficient, or be a combination of the above-mentioned coefficients. An electrically conductive heatsink 914 is connected to the TE 902. Alternately but not shown, the HS may be electrically isolated from TE 902, or the HS may be an electrical insulator.

A thermal electric binary logic circuit and method have been provided. Examples of particular schematics and circuit layouts have been given to help explain the invention. However, the invention is not limited to merely these examples. Other variations and embodiments of the invention will occur to those skilled in the art.

I claim:

1. A method for electric binary logic circuit switching, the method comprising:
   accepting an input voltage representing an input logic state;
   generating a thermal electric (TE) temperature value in response to the input voltage;
   in response to the TE temperature value, generating a TE voltage; and,
   supplying an output voltage representing an output logic state.

2. The method of claim 1 wherein generating the TE temperature value includes:
   providing a first TE element connected to the input voltage and a current source/sink having an intermediate voltage, approximately midway between an input logic high voltage and an input logic low voltage; and,
   the first TE element generating a first temperature.

3. The method of claim 2 wherein generating the TE voltage includes:
   providing a second TE thermally connected to the first TE, electrically connected to a first voltage reference, and electrically connected to an output to supply the output voltage; and,
   varying a first voltage across the second TE in response to the first temperature.

4. The method of claim 1 wherein generating the TE temperature value includes:
   providing a first TE element connected to the input voltage;
   providing a second TE element electrically connected to the first TE element and a current source/sink;
   the first TE generating a first temperature; and,
   the second TE generating a second temperature.

5. The method of claim 4 wherein supplying the second TE element connected to the current source/sink includes electrically connecting to a current source/sink reference having an intermediate voltage, approximately midway between an input logic high voltage and an input logic low voltage.

6. The method of claim 4 wherein generating the TE voltage includes:
   providing a third TE thermally connected to the first TE and electrically connected to a first voltage reference;
   providing a fourth TE thermally connected to the second TE, and electrically connected to the third TE and a second reference voltage;
   varying a first voltage across the third TE in response to the first temperature; and,
   varying a second voltage across the fourth TE in response to the second temperature.

7. The method of claim 6 wherein supplying an output voltage representing an output logic state includes supplying an output voltage that is a ratio of the first voltage divided by the combination of the first and second voltages.

8. The method of claim 1 wherein accepting the input voltage includes accepting an input voltage representing a first logic state; and,
   wherein supplying the output voltage includes supplying an output voltage representing an output logic state selected from a group consisting of the first logic state and a second logic state, opposite to the first logic state.

9. A thermal electric binary logic circuit comprising:
   a first thermal electric (TE) element having a first electrical interface to accept an input voltage representing an input logic state, a second electrical interface, and a thermal interface to supply a first temperature responsive to the input voltage;
   a second TE element having a first electrical interface, electrically connected to the first TE second electrical interface, a second electrical interface connected to a current source/sink, and a thermal interface to supply a second temperature responsive to the input voltage;
   a third TE element having a first electrical interface connected to a first reference voltage, a second electrical interface to supply an output voltage, and a thermal interface thermally connected to the first TE element thermal interface; and,
   a fourth TE element having a first electrical interface connected to the third TE element second electrical interface, a second electrical interface connected to a second reference voltage, and a thermal interface thermally connected to the second TE element thermal interface.

10. The logic circuit of claim 9 wherein the second TE element second electrical interface is electrically connected to a current source/sink reference having an intermediate voltage, approximately midway between an input logic high voltage and an input logic low voltage.

11. The logic circuit of claim 9 further comprising:
   a first heatsink thermally connected to the first TE element second electrical interface and to the second TE element first electrical interface; and,
   a second heatsink thermally connected to the third TE element first electrical interface and to the fourth TE element second electrical interface.

12. The logic circuit of claim 11 wherein the first TE element first electrical interface and thermal interface are the same;
   wherein the second TE element second electrical interface and thermal interface are the same;
   wherein the first voltage reference has a higher potential than the second voltage reference; and,
   wherein the third TE element second electrical interface supplies a logic signal inverted from the input signal.

13. The logic circuit of claim 11 wherein the first TE element first electrical interface and thermal interface are the same;
   wherein the second TE element second electrical interface and thermal interface are the same;
   wherein the first voltage reference has a lower potential than the second voltage reference; and,
   wherein the third TE element second electrical interface supplies a logic signal non-inverted from the input signal.

14. The logic circuit of claim 11 wherein the first heatsink electrically connects the first TE element second electrical interface to the second TE element first electrical interface.

15. The logic circuit of claim 9 further comprising:
   a first heatsink thermally connected to the first TE element first electrical interface and to the second TE element second electrical interface; and,
   a second heatsink thermally connected to the third TE element first electrical interface and to the fourth TE element second electrical interface.

16. The logic circuit of claim 15 wherein the first TE element second electrical interface and thermal interface are the same;
   wherein the second TE element first electrical interface and thermal interface are the same;
   wherein the first voltage reference has a higher potential than the second voltage reference; and,
   wherein the third TE element second electrical interface supplies a logic signal non-inverted from the input signal.

17. The logic circuit of claim 15 wherein the first TE element second electrical interface and thermal interface are the same;
   wherein the second TE element first electrical interface and thermal interface are the same;
   wherein the first voltage reference has a lower potential than the second voltage reference; and,
   wherein the third TE element second electrical interface supplies a logic signal inverted from the input signal.

18. The logic circuit of claim 9 further comprising:
   a thermally conductive electrical insulator interposed between the first TE element thermal interface and the third TE element thermal interface; and,
   a thermally conductive electrical insulator interposed between the second TE element thermal interface and the fourth TE element thermal interface.

19. The logic circuit of claim 9 wherein the first, second third, and fourth TEs are each a thermocouple.

20. A thermal electric binary logic circuit comprising:
   a first thermal electric (TE) element having a first electrical interface to accept an input voltage representing an input logic state, a second electrical interface connected to a current source/sink, and a thermal interface to supply a first temperature responsive to the input voltage; and,
   a second TE element having a first electrical interface connected to a first reference voltage, a second electrical interface to supply an output voltage responsive to the first temperature, and a thermal interface thermally connected to the first TE element thermal interface.

21. The logic circuit of claim 20 wherein the first TE element second electrical interface is electrically connected to a current source/sink reference having an intermediate voltage, approximately midway between an input logic high voltage and an input logic low voltage.

22. The logic circuit of claim 20 further comprising:
   a first heatsink thermally connected to the first TE element first electrical interface;
   a second heatsink thermally connected to the second TE element first electrical interface;

wherein the first TE element second electrical interface and thermal interface are the same; and, wherein the second TE element second electrical interface and thermal interface are the same, and the second TE element supplies a logic signal inverted from the input logic signal.

23. The logic circuit of claim 20 further comprising:

a first heatsink thermally connected to the first TE element second electrical interface;

a second heatsink thermally connected to the second TE element second electrical interface;

wherein the first TE element first electrical interface and thermal interface are the same; and, wherein the second TE element first electrical interface and thermal interface are the same, and the second TE element supplies a logic signal non-inverted from the input logic signal.

24. The logic circuit of claim 20 wherein the first and second TEs are each a thermocouple.

25. A thermal electric binary logic circuit comprising:

a thermal electric (TE) element having a first electrical interface to accept an input voltage representing an input logic state, a second electrical interface connected to a current source/sink, and a thermal interface to supply a first temperature responsive to the input voltage; and, a thermistor having a first electrical interface connected to a first reference voltage, a second electrical interface to supply an output voltage responsive to the first temperature, and a thermal interface thermally connected to the first TE element thermal interface.

26. The logic circuit of claim 25 wherein the TE element second electrical interface and thermal interface are the same; and, wherein the thermistor second electrical interface supplies a logic signal inverted from the input logic signal.

27. The logic circuit of claim 25 wherein the TE element first electrical interface and thermal interface are the same; and, wherein the thermistor second electrical interface supplies a logic signal non-inverted from the input logic signal.

28. The logic circuit of claim 25 wherein the TE is a thermocouple.

29. The logic circuit of claim 25 wherein the thermistor is selected from a group consisting of positive coefficient, negative coefficient, linear coefficient, non-linear coefficient, and combinations of the above-mentioned coefficients.

* * * * *

UNITED STATES PATENT AND TRADEMARK OFFICE
CERTIFICATE OF CORRECTION

PATENT NO.       : 7,564,267 B1                                                              Page 1 of 1
APPLICATION NO.  : 12/040765
DATED            : July 21, 2009
INVENTOR(S)      : Joseph Patterson It is certified that error appears in the above-identified patent and that said Letters Patent is hereby corrected as shown below:

On the cover sheet item (73), it states that the Assignee is Sharp Laboratories of America, Inc. The actual Assignee is Applied Micro Circuits Corporation.

The cover sheet should read:

Assignee:   Applied Micro Circuits Corporation
            San Diego, CA (US)

Signed and Sealed this

Sixteenth Day of February, 2010

David J. Kappos
*Director of the United States Patent and Trademark Office*